Jan. 6, 1970 J. V. STOVER ET AL 3,488,525

SERIES-CONNECTED COMPLEMENTARY TRANSISTOR PAIR SWITCHING CIRCUIT

Filed Nov. 17, 1966 2 Sheets-Sheet 1

INVENTOR.
JOE V. STOVER,
GEORGE SLOAN,

Thomas R. Boston

ATTORNEY.

3,488,525

SERIES-CONNECTED COMPLEMENTARY TRANSISTOR PAIR SWITCHING CIRCUIT

Joe V. Stover, Fullerton, and George Sloan, Anaheim, Calif., assignors to Hughes Aircraft Company, Culver City, Calif., a corporation of Delaware Filed Nov. 17, 1966, Ser. No. 595,070
Int. Cl. H03k 17/00, 3/26
U.S. Cl. 307—255 7 Claims

ABSTRACT OF THE DISCLOSURE

The switching circuit comprises two or more series connected, transistorized circuit stages, each circuit stage comprising a complementary pair of transistors interconnected to form a regenerative closed loop. No separate base drive is required to maintain state. In addition, when one stage is saturated, the other stages in the series circuit are automatically driven to low impedance. To change the transistors in each circuit stage to the high impedance state, control means momentarily reduces the current gain in one of the stages to less than unity. This causes all stages to shift to high impedance.

This invention relates to switching circuitry and, more particularly, to a circuit for controlling the supply of energy to a load from a source of electric energy.

At present, most switching circuits which are used to control the flow of electric power from an energy source, such as a voltage source or battery, to a load employ high vacuum or gas discharge type switching tubes. The impedance across such tubes, which are generally connected in series with the load across the source, is made to vary as a function of their state of conduction, thereby varying the impedance connected in series with the load which affects the power applied thereto. Circuits for switching high voltage, high power have also been designed employing conventional low power transistors. However, such circuits have been found to be of limited use because of the overall complexity of design, requiring a plurality of drive coupling networks and high drive power requirements.

Briefly, in the prior art of high voltage, high power transistorized switching circuits, a plurality of low voltage transistors are connected in series with each other, as well as with the load. These transistors are switched between conductive and nonconductive states. In the conductive state, the transistors provide a minimum of impedance in series with the load, so that most of the high voltage of the source is applied across the load. On the other hand, in the nonconductive state, the transistors provide a high impedance in series with the load, so that most of the high voltage from the source is across the transistors. These transistors, which generally require matching of critical device characteristics, are shunted by resistor and capacitor networks to aid in equalizing distribution of voltages across the serially connected transistors during the nonconductive or OFF period, as well as during the transition times between one state and the other. Prior art circuits generally require that drive power be supplied to the base to emitter junction of each of the transistors during the pulse duration when the transistors are switched to their conductive or ON state. Thus, a separate base drive coupling network must be provided for each of the transistors, which together with the drive power for each transistor result in a relatively complex circuit.

Other limitations of prior art switching circuits employing low voltage transistors for switching high voltage, high power, include the dissimilar performance characteristics and bandwidth limitations of the base drive coupling networks associated with each transistor. These undesirable characteristics of the base drive networks limit the fidelity of the load voltage waveshape. Also, since these base drive coupling networks must supply base drive power throughout the duration of the load voltage waveshape, the achievable minimum load voltage rise and fall times are directly related to the load voltage pulse width.

It is therefore an object of the present invention to provide a new switching circuit which is not limited by the prior art disadvantages.

Another object of the present invention is the provision of a new transistorized circuit for switching high voltage, high power with low voltage transistors.

Yet another object of the present invention is to provide a new transistorized circuit requiring a minimum of drive power to drive low voltage transistors to control the switching of high energy.

A further object of the present invention is the provision of a voltage switching circuit, employing low voltage transistors requiring a minimum of circuitry for switching the transistors from one state of conduction to the other.

Yet a further object of the present invention is to provide a highly reliable switching circuit employing low voltage transistors in which the danger of failure of any of the transistors due to non-uniform voltage distribution is greatly minimized.

Still a further object of the present invention is to provide a switching circuit, for switching high voltage, high power between a voltage source and a load at a relatively high rate with the rise and fall time of the switched voltage being independent of the load voltage pulse width.

Still a further object is the provision of a transistorized switching circuit whereby energy is switchable to a load for a predetermined duration, which is electronically variable over a wide range.

These and other objects of the invention are achieved by providing a switching circuit comprising two or more transistorized circuit stages, each including a pair of transistors interconnected to form a regenerative closed loop. When the product of the current gains of the two transistors in each stage is equal to or greater than unity, an unstable condition exists, tending to drive the two transistors into conduction. As a result, a low impedance exists across the stage. After the transistors are switched to their conductive states, no additional base drive current is required to maintain the transistors in their conductive state. Thus the need, present in the prior art, of providing continuous base drive power to maintain the conduction state for each transistor or stage is eliminated in the circuitry of the present invention. In addition, by driving the transistors in one stage to their conductive state, the current in the other states is automatically increased which causes the transistors in the other stages to conduct. Thus, by driving the transistors in one state to conduction, all the transistors are driven into conduction. Consequently, the need for a separate base drive coupling network for each stage is eliminated.

To reestore the transistors in each circuit stage to their nonconductive state, it is merely necessary to momentarily reduce the magnitude of the total current gain of the transistors in only one of the circuit stages to less than unit. Once the transistors in that stage are switched to their nonconductive state, a similar effect occurs in the transistors in the other stages, so that all the transistors are switched to their nonconductive states. As a result, each of the stages provides a high impedance thereacross so that the total impedance in series with the load is greatly increased, thereby substantially reducing the voltage applied to the load. On the other hand, when the transistors of the various stages are in their conductive states, each circuit stage provides a relatively low impedance in series with the load, so that the total impedance of the transistor circuit with respect to the load is quite small. Thus, most of the voltage is applied to the load.

The novel features that are considered characteristic of this invention are set forth with particularity in the appended claims. The invention will best be understood from the following description when read in conjunction with the accompanying drawings.

DESCRIPTION

Figure 1:
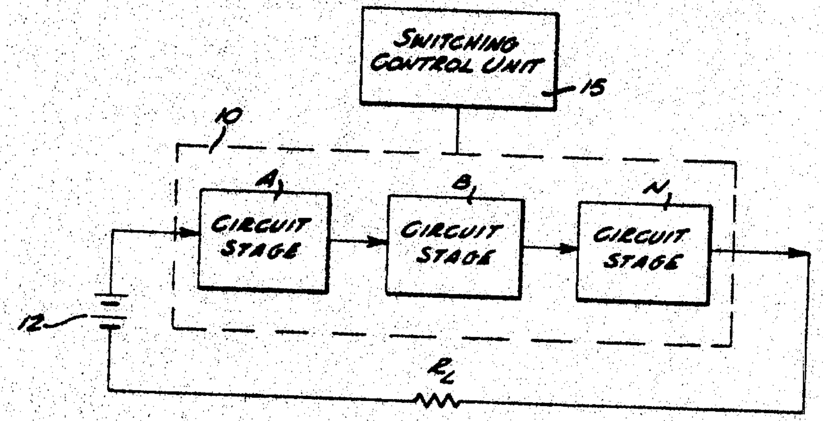
FIGURE 1 is a simplified block diagram useful in explaining the application of the switching circuit of the present invention.

Attention is now directed to FIG. 1 which is a simplified block diagram, useful in describing the function of the switching circuit of the present invention, as well as some of the principles of operation thereof. In FIG. 1, a switching circuit 10 is shown connected in series with a source of energy such as battery 12, representing a voltage source, and a load, generally designated $R_L$. Through the load shown is resistive, other non-resistive loads may be employed. Also, the battery may be replaced by a current source. Thus, even though the invention hereafter will be described in conjunction with a voltage source, it should be assumed to generally represent a source of electrical energy. The switching circuit is shown comprising a plurality of three circuit stages, designated A, B, and N, although any number of stages may be incorporated. A switching control unit 15, which will be described hereinafter in detail, is shown connected to the switching circuit 10.

Briefly described, the function of the switching circuit 10 is to control the voltage from source 12 which is applied to the load $R_L$ by means of varying the resistance or impedance across the circuit 10. Each of the circuit stages, as will be described hereafter in detail, comprises a pair of complementary transistors, interconnected to form a regenerative closed loop circuit in which the two transistors are switched to be in either a conductive state or a nonconductive state. When the transistors are in a conductive state, the impedance across each circuit stage is low, so that the total impedance across the switching circuit 10 is relatively low with respect to $R_L$ and therefore, most of the voltage from source 12 is applied across load $R_L$. On the other hand, when the transistors in each of the circuit stages are in their nonconductive state, the impedance across each circuit stage is relatively high and therefore the total impedance of the switching circuit 10 is quite large so that most of the voltage from source 12 is applied across the switching circuit 10, rather than the load $R_L$.

The switching of the transistors of the various circuit stages from their nonconductive to their conductive state is accomplished by signals or pulses from the switching control unit 15. Such signals may take the form of a first control pulse, hereafter also referred to as the ON pulse, applied to a control network, which may be coupled to one or more of the circuit stages in such a manner as to increase the product of the current gains of the two transistors in the stage to unity or greater. Once this condition is achieved, the two interconnected transistors which form a regenerative closed loop, are switched to their conductive state and remain in such state until the product of their current gains is reduced to below unity.

Once the transistors in one of the stages are switched to their conductive state, the current gains of transistors in adjacent stages are increased sufficiently due to the direct base to emitter coupling between adjacent stages, and raises the current gain products of the two transistors in each stage to be unity or greater. Consequently, all the transistors of the various circuit stages are switched to their conductive states. This results in a relatively low impedance across each one of the stages and therefore across the entire switching circuit 10, so that most of the voltage from source 12 is applied to the resistive load $R_L$.

Once the transistors in each stage are in their conductive states, they remain in such state until the product of the current gains of the transistors in one stage is disturbed by an OFF pulse, which reduces the current gain product to below unity, causing the transistors to switch to their nonconductive or OFF state. The ON pulse, necessary to initiate the switching of the transistors to their conductive state, need only be applied during a short time duration, sufficient to increase the product of current gains in one of the stages to the value where regenerative closed loop action occurs, rather than during the entire duration that the transistors are to be in their conductive state, as is the case in prior art switching circuits.

As herebefore indicated, once the transistors are switched to their conductive states, they remain in such state until the total or product of the current gains in one of the stages is reduced to a value below the predetermined value, such as unity. When this occurs, the transistors in that particular stage tend to switch to their nonconductive state, thereby increasing the impedance thereacross, which in turn affects the curret in the other stages through the direct base to emitter coupling between adjacent stages, which result in a similar switching of the transistors in the other stages from their conductive to their nonconductive state. Reducing the current gains' product in one of the stages so as to initiate the switching of the transistors to an OFF state, is accomplished by providing the OFF pulse from the switching control unit. Such pulse may be applied to one or more of the circuit stages, so as to reduce the base current in one of the transistors therein and thereby reduce the total current gain in the regenerative closed loop of the particular stage. Just like the ON pulse, the OFF pulse need only be applied during a short time duration sufficient to initiate the reduction of the current gain, rather than during the entire time when the transistors are to be in their nonconductive state.

Figure 2:
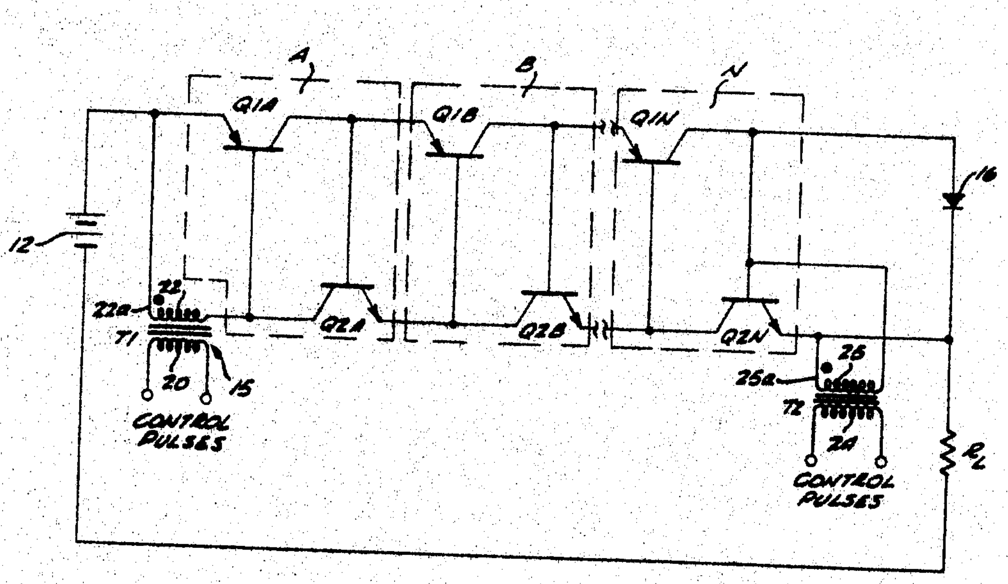
FIG. 2 is a simplified schematic diagram of one embodiment of the invention.

For a better understanding of the teachings of the present invention, reference is now made to FIG. 2 which is a simplified schematic diagram of one embodiment of the invention. Therein, each of stages A, B, and N is shown including two complementary transistors, designated Q1 and Q2, followed by the letter designating the particular stage, such as Q1A and Q2A of stage A, etc. The Q1 transistor is a PNP type, while transistor Q2 is an NPN type. A diode 16 is shown connected across the base and emitter of Q2N. In each stage, the collector and base of one transistor are connected to the base and collector respectively of the other transistor. Being so interconnected, the two transistors form a regenerative closed loop. When the product of the current gains of the two transistors is equal to unity or greater, an unstable condition exists which tends to drive both transistors to a conductive state or saturation, also referred to as the ON state. On the other hand, when the product of the current gains of the two transistors, also referred to as the total current gain of the stage, is less than unity, both transistors are driven to a nonconductive or OFF state. When the total current gain of a stage is unity or greater and the transistors are in the ON state, the stage may be thought of as being in the ON state. On the other hand, when the stage's total current gain is less than unity, the stage may be thought of as being in the OFF state.

Since the product of the current gains of the transistors is dependent on the current gain of each transistor which is dependent on current, initiation of the condition where the total stage's current gain is unity or greater, can be achieved by momentarily increasing the leakage current through one or both transistors in one of the stages. Thereafter, no additional current need be supplied, since once the total stage gain is equal to or greater than unity, the two transistors are switched to their conductive state and remain there until the total stage gain is disturbed and momentarily reduced to below unity.

The increase of the leakage current of one of the transistors is provided by the switching control unit 15 which in FIG. 2 is shown consisting of a coupling transformer T1 having a primary winding 20 which is assumed to be connected to a source of control pulses (not shown). The secondary winding 22 of T1 is connected across the emitter and base of Q1A. By applying a control pulse to the primary 20 so that the dotted end *22a* of the secondary 22 is positive, the emitter to base voltage of Q1A increases. Assuming that the increase is sufficient to raise the current gain of Q1A so that the product of the current gains of Q1A and Q2A is unity or greater, and unstable condition is developed, causing Q1A and Q2A to switch to their conductive or ON state. When Q2A is in a conductive state, the conduction of the base current in Q2A establishes a voltage difference between its base and emitter of such a polarity, that the emitter to base voltage of Q1B increases, which in turn increases the current gain of Q1B. This raises the product of the current gains of Q1B and Q2B to unity or greater, switching Q1B and Q2B to an ON state.

Such chain effect propagates from stage to stage, until all the stages are in their ON states. As a result, the impedance across each stage is very small so that the total impedance across all the stages as compared with $R_L$ is small. Consequently, source 12 may be thought of as being connected across $R_L$. Once stage A is switched to the ON state, the time required for the other stages to assume the same state (ON) is extremely short so that the effect may be thought of as occurring simultaneously.

To disrupt the supply of voltage or current to load $R_L$, the control stages need be switched to their nonconductive states. This may be accomplished by applying an OFF pulse to the primary winding 20 with a polarity opposite to that of the ON pulse, used to switch the stages to their ON state. When an OFF pulse is applied, a related pulse is induced in the secondary winding 22 which reduces momentarily the base to emitter voltage of Q1A, reducing the collector current thereof, so that the total current gain of stage A is less than unity. This causes Q1A and Q2A to switch to their OFF state, resulting in a high impedance across stage A. This reduces the collector currents of Q1B and Q1N which causes the other stages to switch to the OFF state. As a result, each stage presents a high impedance in series with load $R_L$ so that most of the voltage of source 12 is across the stages, rather than across load $R_L$, thereby disrupting the supply of current thereto.

The switching of the stages to their ON and OFF states need not be limited to affecting the current gain of a single transistor, such as Q1A. Rather, any transistor may be used to effect switching to the ON state while switching to the OFF state may be accomplished by affecting the current gain of any other transistor. For example, unit 15 may include a second coupling transformer T2 having a primary winding 24 and a secondary winding 25. The primary winding is assumed to be connected to a source of OFF control pulses in unit 15. The secondary winding 25 is connected to the base and emitter of Q2N with the dotted end *25a* connected to the emitter.

By applying an OFF pulse to T2 so that the dotted end *25a* is positive, the base current of Q2N is reduced, reducing the current gain thereof which in turn reduces the current gain of stage N to below unity, switching stage N and consequently the other stages to the OFF state. Thus, switching to either state may be accomplished by affecting the current gain of any transistor which in turn affects the total gain of its respective stage.

Figure 3:
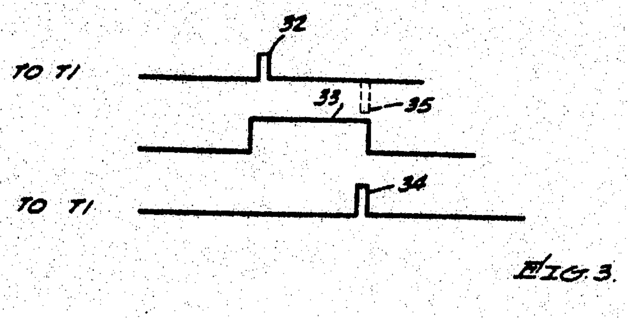
FIG. 3 is a waveform diagram useful in explaining advantages of the invention.

The time relationship between the ON and OFF pulses and the voltage or current pulse applied to load $R_L$ may best be summarized by referring to FIG. 3, which is a simplified diagram of waveforms. Therein, pulse 32 represents an ON pulse which, when applied to the primary windings 20 of T1 (FIG. 2), initiates the switching of the stages to their ON states, thereby producing the leading edge of a pulse 33 which represents voltage or current applied to load $R_L$. Pulse 33 is terminated when an OFF pulse 34 is applied to primary winding 24 of T2, switching the stages to their OFF states and thereby increasing the impedances thereacross, which in turn disrupts the supply of power to the load. Instead of pulse 34, a pulse 35, of a polarity opposite that of pulse 32, may be applied to T1 to disrupt the supply of power to the load. Pulse 35 is diagrammed by broken lines.

From the foregoing, it should be appreciated that the novel switching circuit of the present invention does not require that each stage be supplied with individual ON and OFF pulses to effect the turning on and turning off of the supply of power to the load. Rather, a single ON pulse supplied to any of the stages is sufficient to initiate power turn on, represented by the leading edge of pulse 33 (FIG. 3), while power turn off (trailing edge of 33) is achieved by a single OFF pulse, supplied to the same or any of the other stages. Also, the duration of each of the ON and OFF pulses need only be long enough to effect the total current gain of one of the stages rather than be equal to the duration of pulse 33. The switching circuit operates in either of two stable states, i.e., either in a conductive state or a nonconductive state, so that the shape of pulse 33 is independent of the shapes of the ON and OFF pulses.

Each transistor in the circuit, due to the regenerative closed loop characteristics of each stage, can be driven into saturation independent of its current gain. Therefore, matching of transistors on the basis of identical gain versus current characteristics or identical input impedance characteristics is not required. Also due to the regenerative closed loop characteristics, individual base bias voltages are not required to insure proper transistor operation. A further advantage of the switching circuit of the present invention is its ability to distribute, during the OFF state, the total source voltage between the various stages so that transistors with relatively lower voltage ratings may be used to switch a relatively high voltage from the source to the load with high reliability. For example, when three stages are used, in the OFF state, one-third of the source voltage is across each stage. The switching circuit may include any number of stages so that in the OFF state, the voltage across each stage does not exceed the voltage ratings of the transistors therein.

Figure 4:
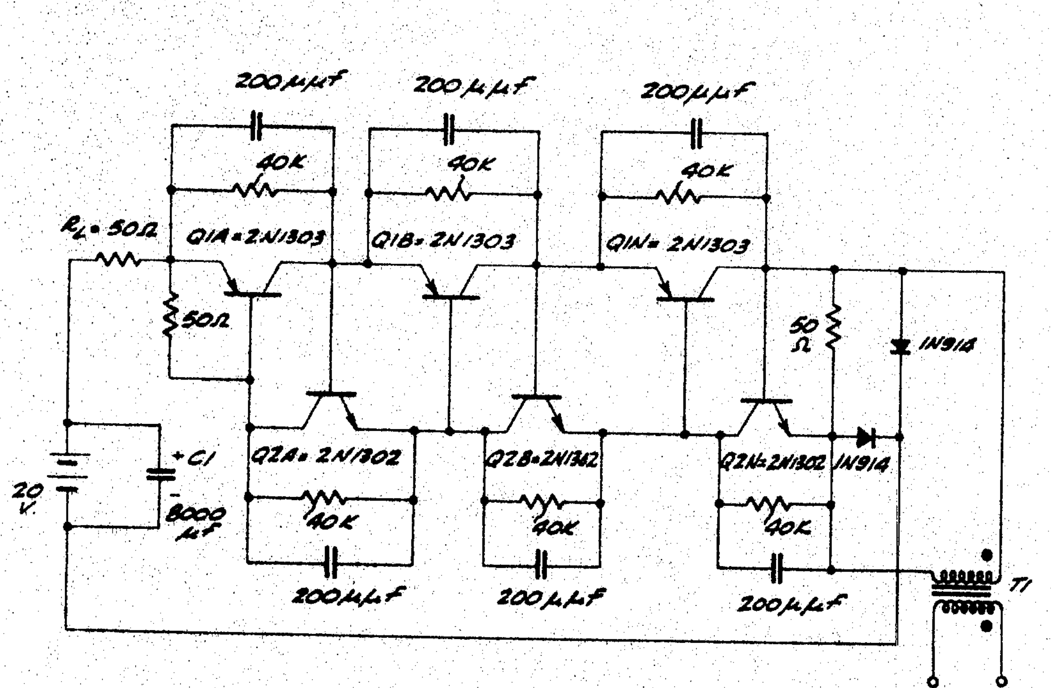
FIG. 4 is a schematic diagram of an embodiment of the invention actually reduced to practice.

One embodiment of the switching circuit of the present invention actually reduced to practice is diagrammed in FIG. 4 to which reference is made herein. Therein, the value and type of each element is designated. In the embodiment, the collector and emitter of each transistor are connected across the parallel combination of a 40K resistor and a capacitor of 200 $\mu\mu$f. The load $R_L$ is a 50 ohm resistor while the source is a 20 volt battery, shunted by a fitering capacitor of 8000 $\mu$f. Fifty ohm resistors are shown connected across the emitter and base of Q1A and Q2N which may be thought of as the input and output transistors of the switching network. Also, two diodes are connected in series between the collector of Q1N and the emitter of Q2N, with the junction point therebetween connected to the cathode of each diode and also to the voltage source to insure the proper flow of current. A single transformer T1 is shown coupled to Q2N to control the ON and OFF states of the circuit. In the embodiment described, T1 is a commercially available transformer. One commercial source is Gudeman Company, selling the transformer as item #G2371.

The embodiment diagrammed in FIG. 4 is presented as but one example of a switching circuit, constructed in accordance with the teachings of the invention. It should be appreciated that modifications and/or equivalents may be substituted without departing from the true spirit of the invention. Therefore, all such modifications and/or equivalents are deemed to fall within the scope of the invention as claimed in the appended claims.

What is claimed is:

1. A switching circuit comprising:

a plurality of stages, each stage including a first transistor of a first type and a second transistor of a second type, each transistor having predetermined current gain characteristics, and means connecting said first and second transistors so that both transistors are in a conductive state when the product of the current gains thereof is not less than a predetermined value and in a non-conductive state when the product of the current gains is less than said value, said first and second transistors being PNP and NPN type transistors respectively, each transistor having a base, an emitter and a collector, means in each stage connecting the base and collector of said first transistor to the collector and base respectively of said second transistor to form a generative closed loop wherein said first and second transistors are in a conductive state when the product of the current gains thereof is not less than unity;

interconnecting means for connecting said stages to form a serial sequence of interconnected stages, said interconnecting means comprising means connecting the collector of PNP transistor in one stage to the emitter of the PNP transistor in a succeeding stage and the emitter of the NPN transistor in said one stage to the collector of the NPN transistor in said succeeding stage to form said serial sequence of stages; and control means coupled to at least one of said stages for controlling the states of conduction of said stages by controlling the product of the current gains of the first and second transistors of the stage to which it is coupled.

2. The circuit as recited in claim 1 wherein said control means includes means coupled to the base and emitter of one of the transistors in one of said stages and adapted to receive control pulses to control the forward current gain of said one of the transistors to which it is coupled.

3. The circuit as recited in claim 1 wherein said control means includes a first coupling network coupled between the emitter and base of one transistor in a first stage, said first coupling network being adapted to receive an ON control pulse to increase the forward current gain of said one transistor to which it is coupled, whereby the product of the current gains of the transistors in said first stage is at least equal to unity, said control means further including a second coupling network coupled between the emitter and base of one transistor in a second stage, said second coupling network being adapted to receive an OFF control pulse to decrease the forward current gain of said one transistor of said second stage to which it is coupled whereby the product of the current gains of the transistors of said second state is less than unity.

4. A switching circuit for controlling the supply of current from a source to a load through said circuit as a function of the circuit's impedance, comprising:

a plurality of serially interconnected control stages operable to be in either a conductive state or a non-conductive state;

means connecting the serially interconnected control stages in series with said load across said source, whereby the current supplied to said load is a function of the impedance across said serially interconnected stages;

each stage including a pair of complementary transistors comprising an NPN transistor and a PNP transistor, each transistor having a base, an emitter and a collector and predetermined $\beta$ characteristics, coupling means in each stage coupling the base and collector of said PNP transistor to the collector and base of the NPN transistor;

means directly connecting the collector and emitter of the PNP and NPN transistors respectively of each stage to the emitter and collector of the respective PNP and NPN transistors of a succeeding stage; and control means coupled to at least one transistor of one stage, said control means being adapted to receive control pulses to control the state of conduction of the serially interconnected stages.

5. The switching circuit as recited in claim 4 wherein the transistors of each stage are switched to a conductive state when the product of the current gains of the transistors in one of the stages is at least equal to unity.

6. The switching circuit as recited in claim 5 wherein said control means includes means coupled to the base and emitter of one of the transistors in one of said stages and adapted to receive control pulses to control the forward current gain of said one of the transistors to which it is coupled.

7. The switching circuit as recited in claim 5 wherein said control means includes a first coupling network coupled between the emitter and base of one transistor in a first stage, said first coupling network being adapted to receive an ON control pulse to increase the forward current gain of said one transistor to which it is coupled, whereby the product of the current gains of the transistors in said first stage is at least equal to unity, said control means further including a second coupling network coupled between the emitter and base of one transistor in a second stage, said second coupling network being adapted to receive an OFF control pulse to decrease the forward current gain of said one transistor of said second stage to which it is coupled whereby the product of the current gains of the transistors of said second stage is less than unity.

References Cited

UNITED STATES PATENTS 3,165,647 1/1965 De Bottari et al. ___ 307—288 X
3,268,738 8/1966 Deavenport ______ 307—288 X DONALD D. FORRER, Primary Examiner U.S. Cl. X.R.

307—313